United States Patent [19]

Maute

[11] 3,796,931

[45] Mar. 12, 1974

[54] P-N JUNCTION SEMICONDUCTOR DEVICE PROVIDED WITH AN INSULATING LAYER HAVING TWO STABLE RESISTANCE STATES

[75] Inventor: Hans-Jürgen Maute, Heilbronn-Brockingen, Germany

[73] Assignee: Licentia Patent-Verwaltungs-G.m.b.H., Frankfurt am Main, Germany

[22] Filed: Sept. 25, 1970

[21] Appl. No.: 75,324

[30] Foreign Application Priority Data

Sept. 27, 1969 Germany ........................... 1948895
Sept. 27, 1969 Germany ........................... 6937807

[52] U.S. Cl. ..... 317/235 R, 317/234 F, 317/234 N, 317/235 AG, 340/173
[51] Int. Cl. ......................... H01l 11/00, H01l 15/00
[58] Field of Search .......... 317/234, 235, 3.1, 9, 10, 317/5.4, 21, 28, 46; 29/576, 585–589; 340/173

[56] References Cited

UNITED STATES PATENTS

| | | | |
|---|---|---|---|
| 3,445,823 | 5/1969 | Petersen | 340/173 |
| 3,634,927 | 1/1972 | Neale et al. | 29/576 |
| 3,675,090 | 7/1972 | Neale | 317/234 |
| 3,312,924 | 4/1967 | Eubank et al. | 317/234 |
| 3,336,484 | 8/1967 | Ovshinsky | 307/248 |
| 3,432,417 | 3/1969 | Davidse et al. | 317/234 |
| 3,453,583 | 7/1969 | Shanefield et al. | 317/234 |
| 3,576,549 | 4/1971 | Hess | 317/234 |

FOREIGN PATENTS OR APPLICATIONS

| | | | |
|---|---|---|---|
| 1,078,790 | 8/1967 | Great Britain | 317/234 |

*Primary Examiner*—John S. Heyman
*Assistant Examiner*—Andrew J. James
*Attorney, Agent, or Firm*—Spencer and Kaye

[57] ABSTRACT

A semiconductor device comprising a monocrystalline semiconductor body having at least two regions of different types of conductivity and an insulating layer which is provided at the surface of the semiconductor body and which consists of a material which can assume states of different resistance.

11 Claims, 3 Drawing Figures

*Inventor:*
Hans-Jürgen Maute
BY *Spencer & Kaye*
ATTORNEYS.

P-N JUNCTION SEMICONDUCTOR DEVICE PROVIDED WITH AN INSULATING LAYER HAVING TWO STABLE RESISTANCE STATES

BACKGROUND OF THE INVENTION

The present invention relates to a semiconductor device consisting of a monocrystalline semiconductor body having at least two regions of different types of conductivity and an insulating layer provided on the surface of the semiconductor body.

Diodes, transistors and integrated switching circuits generally consist of monocrystalline silicon, germanium or other semiconducting substances. At the surface of the semiconductor body used to produce the semiconductor device, there is generally a thin insulating layer which serves as a mask during the necessary diffusion and etching processes and, in addition, is indispensable for the passivation of the p-n junction surfaces appearing at the surface of the semiconductor. Extending over the insulating layer are conducting paths which are electrically connected, through apertures in the insulating layer, through the region disposed in the semiconductor body.

In recent times, semiconductor components have become known which consist of a vitreous, amorphous substance. These vitreous substances have the characteristic of being able to assume different states of resistance within limited ranges, and these states may be unrestrictedly stable. Such components are without a barrier layer and are generally used as storage or switching elements. In the state in which they are formed, the vitreous layers have such a high resistance that they can be regarded as insulators. The specific resistance is of the order of magnitude of $10^{10}$ Ohm-centimetres. If such a vitreous layer is brought between two metal electrodes and an increasing voltage is applied to the metal electrodes, then there is a specific threshold voltage value at which the vitreous substance in the region situated between the electrodes changes over to the low-resistance state and retains this state with unrestricted stability even after the voltage has been switched off. In this case, the resistance between the electrodes changes from $10^6$ – $10^{12}$ Ohms for example to a value of 10 Ohms for example.

Said vitreous substances consist of mixtures which contain silicon dioxide, boron trioxide or phosphorous pentoxide for example. In addition, the glass contains the oxides of metals which can assume different valency states. These include the oxides of copper or tungsten for example. Compositions of such glasses are known and have already been published.

SUMMARY OF THE INVENTION

In a monocrystalline semiconductor body which is provided with barrier layers and which is provided with an insulating layer at its surface, the object of the invention is to provide an insulating layer which consists of a material which can assume states of different resistance.

According to a further object of the invention, the insulating layer on the monocrystalline semiconductor body consists of a vitreous material which can assume an extremely high-resistance and extremely low-resistance state, each of which is stable.

The semiconductor device according to the invention has the advantage that the semiconductor body can be completely surrounded on all sides with an insulating layer which does not have to be perforated anywhere, not even for contact-making purposes. Thus ideally passivated semiconductor components are obtained in which distrubing surface effects are completely eliminated. Furthermore, in the semiconductor device according to the invention, the masking and etching step, necessary with the earlier methods, to produce the contact-making windows in the insulating layer, are saved.

In the semiconductor device according to the invention metallic contacts to various semiconductor regions in the semiconductor body are provided on the insulating layer above the associated regions in the semiconductor body. This insulating layer is converted, by forming, into the low-resistance state, in the regions which are situated between the metallic contacts and the associated semiconductor regions. These low-resistance regions of very small area form the current path between the contacts and the semiconductor regions or semiconductor components present in the semiconductor body.

The insulating layer according to the invention on the semiconductor body can also be used as a diffusion mask in the necessary diffusion steps provided that the insulating layer does not contain substances which have a disadvantageous influence on the diffusion process.

After the production of all the semiconductor regions in the semiconductor body, using a diffusion mask which consists of the vitreous ma erial with various possible states of resistance or of another suitable insulating material, an extremely high-resistance insulating layer of vitreous material is applied, preferably to the entire surface of the semiconductor body - possibly after the removal of an existing insulating layer. Metal contacts are provided on this insulating layer above the associated semiconductor regions. A voltage is then applied between each two contacts and stresses the *p-n* junction situated in the current path in the forward direction. This voltage is increased to such an extent that the region of the insulating layer between the metal contacts and the associated semiconductor regions permanently assumes the extremely low-resistance state. After the forming of the insulating layer has been effected point by point, the forming voltage is preferably switched off again immediately.

BRIEF DESCRIPTION OF THE DRAWINGS

The invention will now be further described, by way of example, with reference to the accompanying drawings, in which.

DESCRIPTION OF PREFERRED EMBODIMENTS

Figure 1:
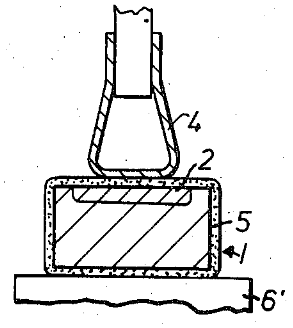
FIG. 1 is a section through one embodiment of a semiconductor device according to the invention.

Referring first to FIG. 1, the semiconductor device is in the form of a diode and comprises a semiconductor body 1, for example of monocrystalline silicon. The basic semiconductor body 3 may be of *p*-type conductivity for example and has, at one major surface, a region 2 of *n*-type conductivity produced by diffusion. This region may also extend over the entire major surface of the semiconductor body, and be produced by epitaxy. After production of the region 2, the entire surface of the semiconductor body is covered with a thin insulating layer 5 which has a thickness of only a few $\mu$ m for example. This insulating layer consists, for example, of a glass-forming oxide such as silicon dioxide, boron trioxide or phosphorous pentoxide, and contains oxides of one or more metals, which can assume various valency states. Examples of such metals are copper or tungsten. The insulating layer 5 is vapour-deposited, fused on or applied by cathodic sputtering, to the semiconductor body 1. The semi-conductor body is preferably secured to a metallic supporting body 6. The semiconductor may be stuck or pressed on to this supporting body. Above the region 2 of *n*-type conductivity, on the insulating layer 5, there is a further contact 4 which consists, for example, of a pressure contact in the form of strip, a point contact, or of a vapour-deposited metal contact. The semiconductor device may be formed before or - as shown in FIG. 2 - after installation in a housing.

Figure 2:
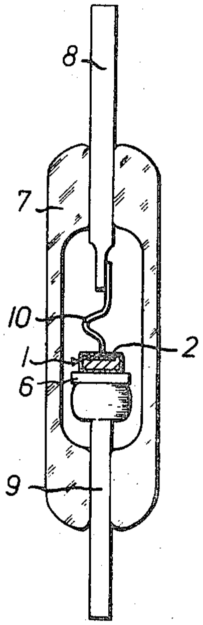
FIG. 2 illustrates the manner in which the device shown in FIG. 1 can be installed in a housing.

A suitable housing for a diode is illustrated in FIG. 2. It consists of an elongated glass envelope 7 with two electrode leads 8 and 9 taken through the glass member in an insulated manner. The end of the electrode lead 9 is constructed in the form of a ram in the interior of the housing and carries the semi-conductor device illustrated in FIG. 1. The electrode lead 8 is connected, through a resiliently mounted point contact 10, to the surface of the semiconductor body opposite to the supporting body 6.

For the forming, a voltage of such a polarity that the p-n junction situated in the current path between the electrodes in the semiconductor body is stressed in the forward direction, is applied between the electrodes 8 and 9. With the conductivity relationships described above, therefore, the electrode 8 must be negatively biassed in comparison with the electrode 9. At a specific voltage, which depends inter alia on the thickness of the insulating layer, a portion of the insulating layer, which is small in cross-section, between the electrodes in the semiconductor body, changes over into the low-resistance state. In this case, the low-resistance current path in the insulating layer is formed substantially by the shortest distance between the electrodes and the conducting semiconductor regions. This low-resistance current path retains this state of resistance permanently while all the remaining regions of the insulating layer remain in the extremely high-resistance state. At the moment of forming the insulating layer in the current-path regions, the voltage and the current in the current path can be limited by a series-connected resistance of suitable magnitude.

Figure 3:
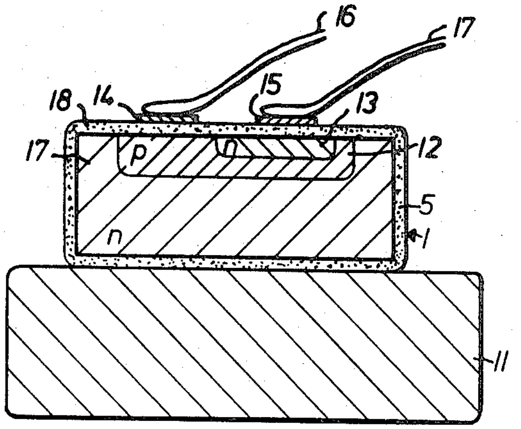
FIG. 3 is a section through a second embodiment of the invention showing a planar transistor with an insulating layer which does not comprise any contact-making window.

In FIG. 3, a planar transistor is illustrated which has been produced by indiffusion of the base region 12 and the emitter region 13 into the basic semiconductor body 17, using a masking layer. After all the regions are finished, the semiconductor body is covered on all sides by an insulating layer 5 which has an extremely high resistance but can assume an extremely low-resistance state within narrow restricted areas, by forming. The basic semiconductor body is again secured to a metallic supporting body 11 which serves as a collector connection. Metallic contacts 14 and 15 are provided on the insulating layer above the base region and above the emitter region respectively. If the transistor has an *n-p-n* sequence of regions for example, then, during the forming, a voltage is first applied between the terminal wires 16 and 17 which lead to the metal contacts 14 and 15, the potential at the electrode 16 being positive in comparison with the potential at the electrode 17. At a specific threshold voltage, a low-resistance current path 18 forms between the contacts 14 and 15 and the subjacent semiconductor regions. The current strengths and the voltage dropping at the insulating layer during the forming can again be limited by a series resistance. Then, or at the same time, a voltage at which the electrode 16 has a positive potential in comparison with the electrode 11, is applied between the electrodes 11 and 16. At a threshold voltage, the last low-resistance passage which is still required forms between the metal body 11 and the collector region 17 in the insulating layer 5. The last forming steps described may also be carried out after the semiconductor component has already been installed in a housing.

The types of conductivity given in the examples for the various semicomductor regions may be reversed. Furthermore, the insulating layer described having two different states of resistance can be used wherever an electrical connection has to be established between different regions or different electrodes.

It will be understood that the above description of the present invention is susceptible to various modifications, changes and adaptations.

What is claimed is:

1. A semiconductor device comprising: a monocrystalline semiconductor body having a plurality of regions of different types of conductivity forming pn junctions therebetween; a continuous insulating layer covering at least a portion of the surface of said semiconductor body overlying each of said regions, said insulating layer being directly provided on said surface of said semiconductor body and consisting of a material which is vitreous and which can assume an extremely high resistance state and an extremely low resistance state, each of said states being stable, said material being changeable from the high resistance state to the low re-sistance state by the application of a threshold voltage across it; and a respective metallic contact for each of said regions, each of said contacts being provided on the surface of said insulating layer over the respective one of said regions in the semiconductor body, said insulating layer being converted into the low resistance state between each said metallic contact and the respective one of said semiconductor regions.

2. A semiconductor device as claimed in claim 1, in which the vitreous material contains a glass-forming oxide.

3. A semiconductor device as claimed in claim 2, in which said glass-forming oxide is silicon dioxide.

4. A semiconductor device as claimed in claim 2, in which said glass-forming oxide is boron trioxide.

5. A semiconductor device as claimed in claim 2, in which said glass-forming oxide is phosphorus pentoxide.

6. A semiconductor device as claimed in claim 1, in which the vitreous material contains oxides of a metal which can assume different valency states.

7 A semiconductor device as claimed in claim 6, in which the vitreous material contains the oxides of copper.

8. A semiconductor device as claimed in claim 6, in which the vitreous material contains the oxides of tungsten.

9. A semiconductor device as claimed in claim 1 wherein: said semiconductor body contains first and second regions of different conductivity types with the pn junction formed therebetween extending to a major surface of said semiconductor body; said insulating layer covers at least said major surface; and at least one of said metallic contacts for said first and second regions is disposed on the surface of said insulating layer over said major surface.

10. A semiconductor device as claimed in claim 9 wherein: said first region extends to the major surface of said semiconductor body opposite said major surface to which said *pn* junction extends; said insulating layer covers at least a portion of said opposite major surface; and said metallic contact for said second region is disposed on the surface of the portion of said insulating layer over said opposite major surface.

11. A semiconductor device as defined in claim 1 wherein said insulating layer covers the entire surface of said semiconductor body.

* * * * *